US007535272B1

(12) United States Patent
Kwong et al.

(10) Patent No.: US 7,535,272 B1
(45) Date of Patent: May 19, 2009

(54) ZERO-DELAY BUFFER WITH COMMON-MODE EQUALIZER FOR INPUT AND FEEDBACK DIFFERENTIAL CLOCKS INTO A PHASE-LOCKED LOOP (PLL)

(75) Inventors: Kwok Kuen David Kwong, Davis, CA (US); Ho Ming Karen Wan, Hong Kong (HK)

(73) Assignee: Hong Kong Applied Science and Technology Research Institute Co. Ltd., Hong Kong (HK)

( * ) Notice: Subject to any disclaimer, the term of this patent is extended or adjusted under 35 U.S.C. 154(b) by 10 days.

(21) Appl. No.: 11/944,545

(22) Filed: Nov. 23, 2007

(51) Int. Cl.
*H03L 7/06* (2006.01)

(52) U.S. Cl. ....................... 327/156; 327/157; 375/376; 331/15; 331/16; 331/17

(58) Field of Classification Search ................. 327/147, 327/156, 157; 375/376; 331/15–17
See application file for complete search history.

(56) References Cited

U.S. PATENT DOCUMENTS 5,157,277 A 10/1992 Tran et al.
5,838,200 A 11/1998 Opris
5,847,601 A 12/1998 Wang
5,933,056 A 8/1999 Rothenberg
6,043,715 A 3/2000 Bailey et al.
6,252,435 B1 6/2001 Wu et al.
6,338,144 B2 1/2002 Doblar et al.
7,020,793 B1 3/2006 Hsieh
7,111,186 B2 9/2006 Han et al.

OTHER PUBLICATIONS

ICS9P750 "DDR PLL Programmable Zero Delay Clock Buffer", Integrated Circuit Systems Inc. Apr. 30, 2003, pp. 1-13.
PCT Search Report and Opinion, PCT/CN/2007/071121, Sep. 4, 2008.

*Primary Examiner*—Tuan Lam
*Assistant Examiner*—Daniel Rojas
(74) *Attorney, Agent, or Firm*—Stuart T. Auvinen; g Patent LLC

(57) ABSTRACT

A zero-delay clock generator has a phase-locked loop (PLL) that generates a feedback clock and receives a reference clocks. All clocks are differential and have a common-mode voltage. The common-mode voltage of an externally-generated reference clock can vary from the common-mode voltage of the internally-generated feedback clock. Differences in common-mode voltage of the reference clock and feedback clock cause delay variations resulting in static phase offsets of generated clocks. A common-mode sense and equalizer senses the common-mode voltages of the buffered reference and feedback clocks, and generates control voltages. The control voltages adjust the common-mode voltage and delay of differential buffers that receive the reference and feedback clocks. The control voltages adjust the differential buffers to match the common-mode voltages of the buffered reference and feedback clocks. The buffered clocks are then applied to a phase and frequency detector of the PLL.

20 Claims, 8 Drawing Sheets

ZERO-DELAY BUFFER WITH COMMON-MODE EQUALIZER FOR INPUT AND FEEDBACK DIFFERENTIAL CLOCKS INTO A PHASE-LOCKED LOOP (PLL)

FIELD OF THE INVENTION

This invention relates to clock buffers, and more particularly to zero-delay phase-locked loop (PLL) clock buffers.

BACKGROUND OF THE INVENTION

Large digital electronic systems have many blocks of circuits that must communicate with each other. Communication is facilitated by the use of clocks that synchronize data transfers. Large systems may require many clock signals that are applied to large loads. These clocks are often synchronized to each other during clock generation. Higher operating speeds required that these clocks be accurate and precise.

Phase-locked loops (PLL's) are used to receive an external clock and to clean up any jitter or other signal distortions. In a PLL, an input clock is compared to a feedback clock that is generated by the PLL, and the feedback clock is altered by the PLL to match the input clock in phase and frequency.

One kind of clock generator that uses a PLL is known as a zero-delay buffer. Many clocks are generated from an input clock. A PLL is used to match a feedback clock to the input clock so that the feedback clock matches the phase and frequency of the input clock. The input clock's buffers are designed to match the buffering from the reference clock to the multiple output clocks that are generated. The PLL ensures that the phases of the output clocks match the input clock phase.

Although the delay through the PLL and buffers are non-zero, the delay is adjusted by the PLL to be exactly one clock period. Thus the delay appears to be zero, since the phases match and the delay is exactly one clock period. Skews in phases between the output clocks and the input clock are driven toward zero by the PLL in the zero-delay clock generator.

Single-ended clocks that could be carried on a single physical wire or trace were common when system speeds were lower. However, today's modern systems operate at blazingly fast speeds, and the single-ended clocks have too many signal distortions that can disrupt system operation. Interference from external sources such as electromagnetic interference can couple into the single-ended clock in noisy environments.

Differential clocks are carried on two physical wires or traces. The clock is represented by the difference in voltages on the two physical wires. Any external interference tends to couple in equally to both physical wires of a differential clock, so the interference tends to cancel out. Differential clocks can use relatively small voltage swings since differential receivers are quite sensitive. The smaller voltage swings reduce signal noise and distortion, producing more accurate clocks.

What is desired is a zero-delay clock generator for differential clocks. A zero-delay clock generator is desired that overcomes problems inherent in differential signals, such as common-mode drift.

DETAILED DESCRIPTION

The present invention relates to an improvement in differential zero-delay clock generators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that differential clocks can be generated with a zero-delay clock generator. However, common-mode voltage drift is a problem. Both physical wires carrying a differential clock have a static voltage known as the common-mode voltage. The clock signal is a small alternating signal with small voltage swings around the common-mode voltage. However, the common mode voltage can drift higher or lower over time due to interference and other reasons. These common-mode drifts can disrupt operation of the zero-delay clock buffer. The inventors have devised circuits to compensate for such common-mode drift.

Figure 1:
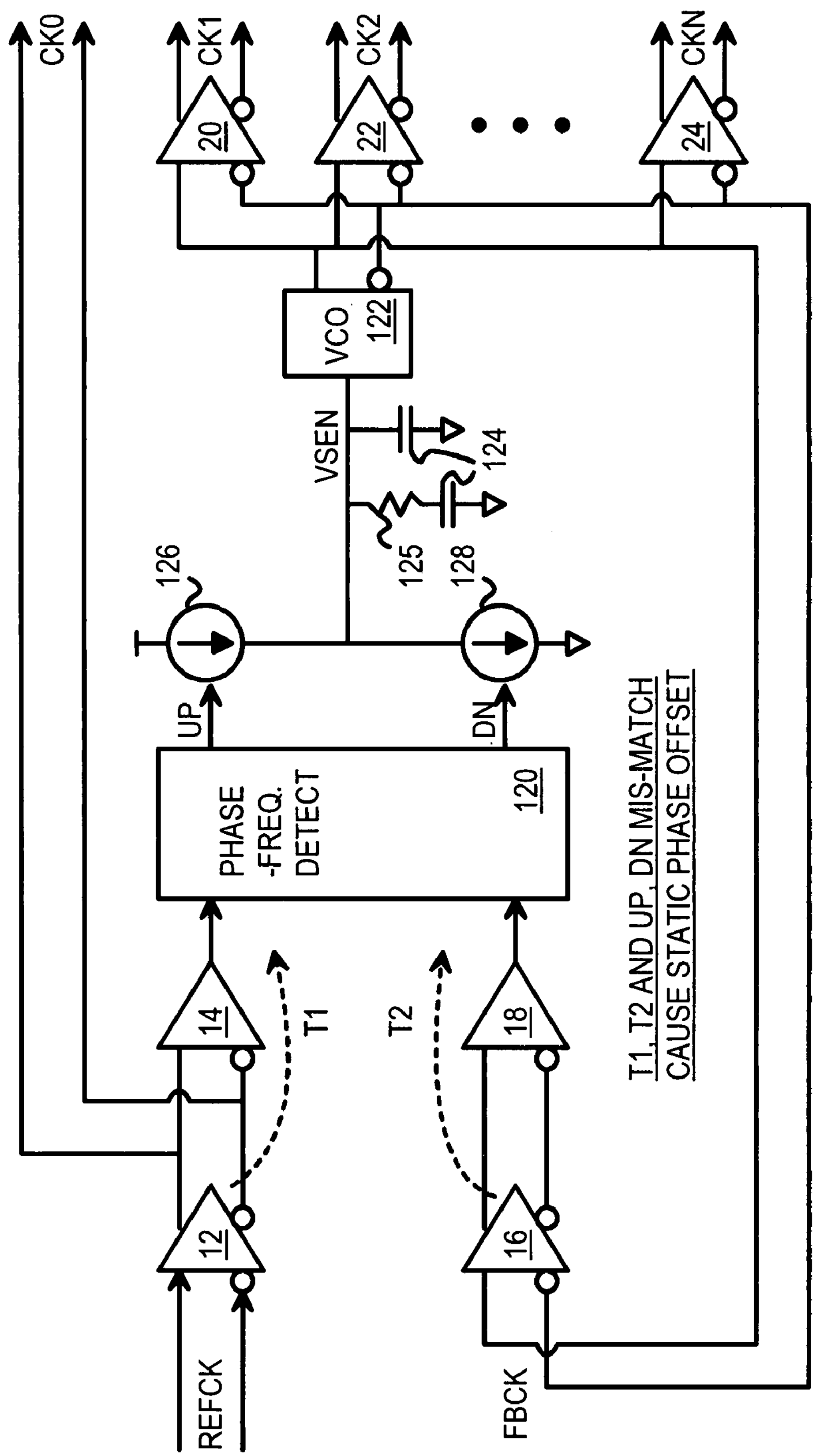
FIG. 1 is a block diagram highlighting a problem of static phase offset in a zero-delay clock generator using differential clocks.

FIG. 1 is a block diagram highlighting a problem of static phase offset in a zero-delay clock generator using differential clocks. A reference clock REFCK is a differential clock that is input to the zero-delay clock generator. The input clock is buffered by differential buffer 12 to generate a first output clock CK0, and then applied to differential-to-single-ended (DTS) converter 14, which generates a single-ended signal that is input to phase and frequency detector 120.

A feedback clock FBCK is another differential clock that is generated by voltage-controlled oscillator (VCO) 122. Feedback clock FBCK is buffered by differential buffer 16 and converted to a single-ended signal by DTS converter 18 that is also input to phase and frequency detector 120.

Phase and frequency detector 120 compares the frequency and phases of the reference and feedback clocks. When phase and frequency detector 120 detects a positive phase difference between the reference and feedback clocks, an UP signal is generated. The UP signal activates current source 126 to charge up capacitors 124, causing the sensing voltage VSEN to rise. The sensing voltage VSEN is input to VCO 122, causing it to slightly increase the frequency of feedback clock FBCK. This increase in frequency of FBCK allows the feedback clock to advance in phase toward the reference clock.

When phase and frequency detector 120 detects a negative phase difference between the reference and feedback clocks, the down DN signal is generated. The DN signal activates current sink 128 to discharge capacitors 124, causing the sensing voltage VSEN to fall. The sensing voltage VSEN is input to VCO 122, causing it to slightly decrease the frequency of feedback clock FBCK. This decrease in frequency of FBCK allows the feedback clock to slow down and shift in phase toward the reference clock.

When the phases and frequencies of the reference and feedback clock match, neither the UP or DN signals are generated. The clocks are in sync. This is the steady-state condition. Leakages of capacitors 125 in the network including resistor 125 can cause phase mismatch to again occur. To compensate for this leakage, the UP or DN signals from phase and frequency detector 120 may be pulsed for a short period of time after phase comparison occurs.

Many clocks can be generated from the feedback clock. Differential buffers 20, 22, 24 buffer feedback clock FBCK to generate output clocks CK1, CK2, . . . CKN. Differential buffers 20, 22, 24 are carefully matched to each other and to differential buffers 12, 16 to minimize skew between the clocks.

However, some mismatches may still occur. The delay T1 for the reference clock through differential buffer 12 and DTS converter 14 may not exactly match the T2 for the feedback clock through differential buffer 16 and DTS converter 18. Also, the charging current from current source 126 may not exactly match the discharging current through current sink 128. These mismatches can cause a static phase offset (SPO) to occur. SPO is undesirable since it causes skews among clocks in the system.

The inventors have realized that a cause of SPO that is unique to differential clocks is common-mode voltage differences. The common mode voltage of a differential clock is the midpoint voltage that the small-swing clock signal alternates around.

Since reference clock REFCK may be generated by an external clock driver while feedback clock FBCK is generated locally by VCO 122, the common-mode voltages of REFCK and FBCK may differ. The power supply voltage of the external clock driver of REFCK could differ from the internal power supply voltage, or circuit differences could occur. Also, the reference clock may pass through a long cable, and external interference may couple into both physical signal wires as a common-mode voltage shift.

When the common-mode voltage of REFCK differs from the common-mode voltage of FBCK, differential buffers 12, 16 may have different delays. Also, the delays through DTS converters 14, 18 may be dependent on the common-mode voltage. Thus common-mode voltage differences between the reference and feedback clocks can result in more variations in delays T1, T2, and add to undesirable phase offset.

Figure 2:
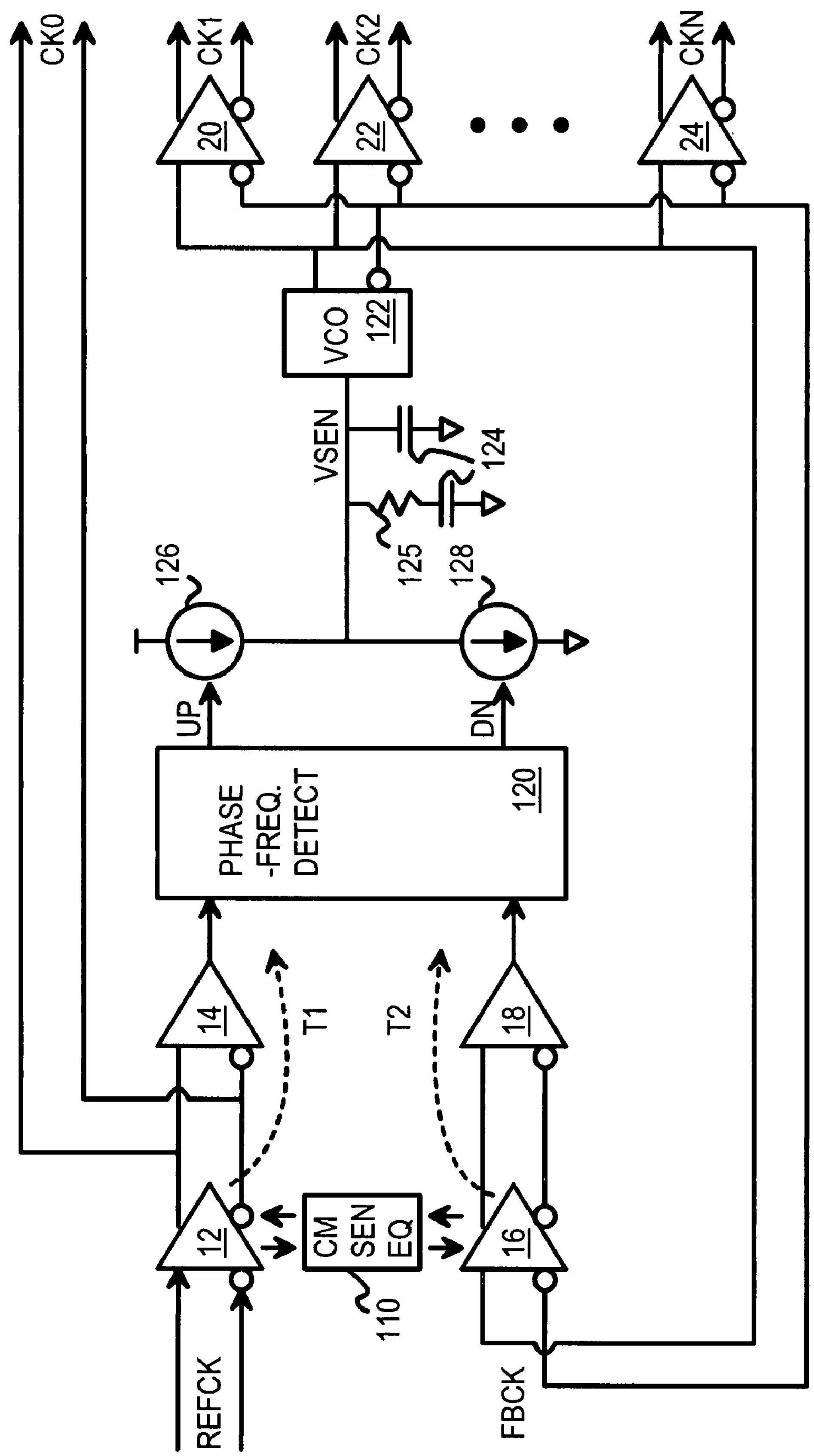
FIG. 2 is a zero-delay clock generator with a common-mode equalizer to reduce phase offsets caused by differences in common-mode voltages of differential clocks.

FIG. 2 is a zero-delay clock generator with a common-mode equalizer to reduce phase offsets caused by differences in common-mode voltages of differential clocks. The PLL operates as described earlier for FIG. 1. However, common-mode sense and equalizer 110 reduces the difference in delays T1, T2 causes by common-mode differences between the reference and feedback clocks.

Common-mode sense and equalizer 110 senses the common-mode voltage of the two physical wires of reference clock REFCK, and also senses the common-mode voltage of the two physical wires of feedback clock FBCK. The difference in common-mode voltages is used to equalize the drive of differential buffers 12, 16 to compensate for the common-mode differences. Common-mode sense and equalizer 110 sends a control voltage back to one or both of differential buffers 12, 16 to adjust their delays. This adjustment in delays causes delays T1, T2 to more closely match than would occur when the common-mode voltages were ignored.

The bad effects of common-mode differences in the reference and feedback clock are mitigated by common-mode sense and equalizer 110 before phase comparison occurs in phase and frequency detector 120. This allows output clocks to match more closely in phase, with less clock skew.

Figure 3:
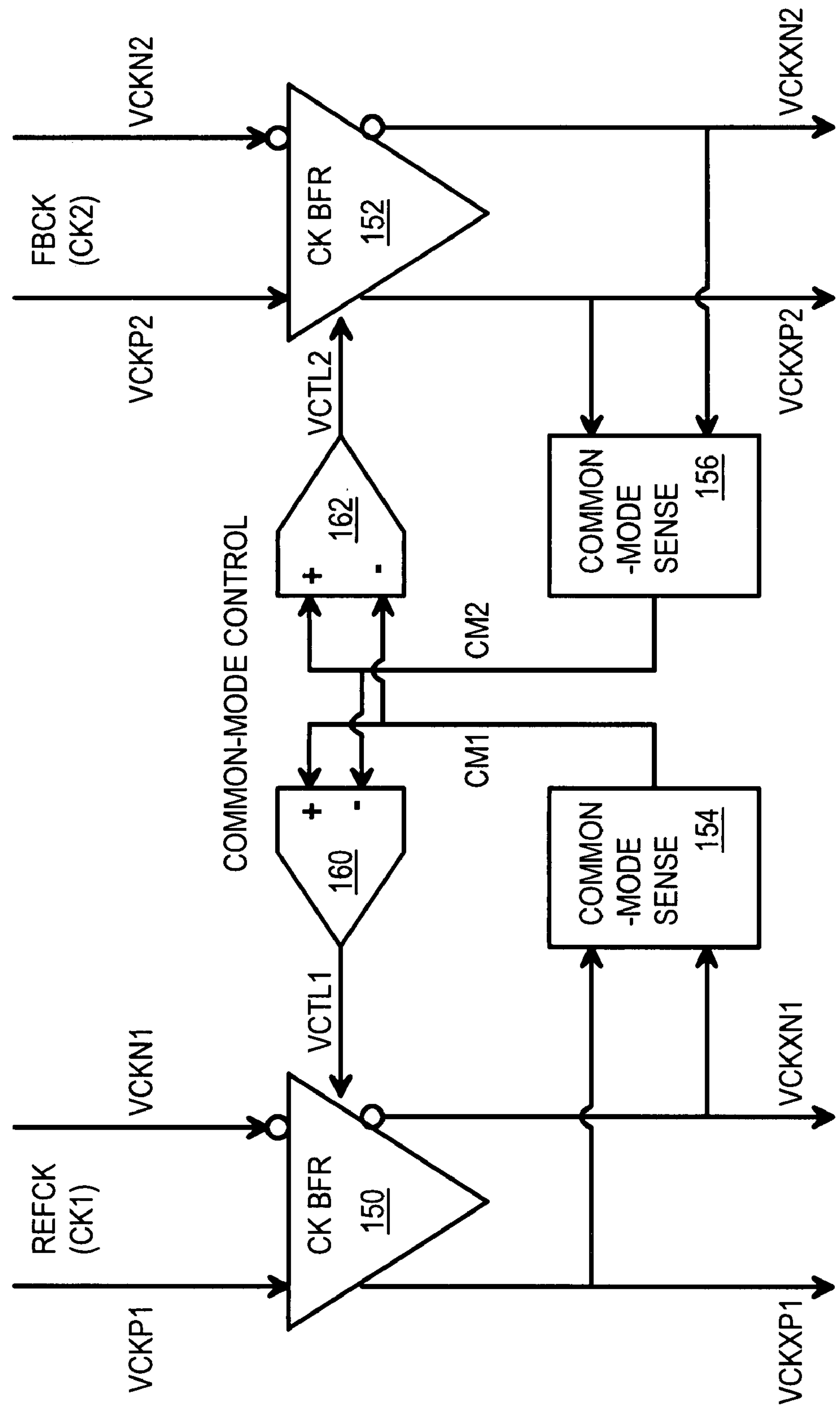
FIG. 3 shows a common-mode sense and equalizer coupled to differential input buffers.

FIG. 3 shows a common-mode sense and equalizer coupled to differential input buffers. Clock buffers 150, 152 are differential buffers such as differential buffers 12, 16 in FIG. 2, while common-mode sensors 154, 156 and common-mode equalizers 160, 162 are an implementation of common-mode sense and equalizer 110 of FIG. 2.

The reference clock REFCK is applied to the differential inputs of clock buffer 150, which outputs first differential clock VCKXP1, VCKXN1. The feedback clock FBCK is applied to the differential inputs of clock buffer 152, which outputs second differential clock VCKXP2, VCKXN2. The first and second differential clocks are later converted to single-ended clocks and input to phase and frequency detector 120 of FIG. 2. Thus the common-mode sense and equalizer operates on differential clocks before phase detection.

The first differential clock VCKXP1, VCKXN1 output by clock buffer 150 is also applied to common-mode sensor 154, which detects and generates a first common-mode voltage CM1. The second differential clock VCKXP2, VCKXN2 output by clock buffer 152 is also applied to common-mode sensor 156, which detects and generates a second common-mode voltage CM2. CM1, the sensed common mode voltage of the first differential clock, and CM2, the sensed common mode voltage of the second differential clock, are both applied as inputs to equalizers 160, 162.

Equalizer 160 receives CM1 on its non-inverting (+) input, and CM2 on its inverting (–) input, and generates first control voltage VCTL1 as the difference of CM1, CM2. Equalizer 162 receives CM2 on its non-inverting (+) input, and CM1 on its inverting (–) input, and generates second control voltage VCTL2 as the difference CM2-CM1.

The first control voltage VCTL1 is applied to first clock buffer 150, while the second control voltage VCTL2 is applied to second clock buffer 152. The control voltages can be used as bias voltages within clock buffers 150, 152 that control the delay through clock buffers 150, 152.

When the common mode voltage of the reference clock is higher than the common mode voltage of the feedback clock, VCM1 is greater than VCM2. The higher VCM1 causes first equalizer 160 to have a higher voltage on its + than its – input, causing equalizer 160 to increase its output, first control voltage VCTL1. The higher VCTL1 is applied to first clock buffer 150. The control voltage may be applied as a bias voltage to an n-channel transistor current sink inside clock buffer 150. As VCTL1 rises, the higher bias voltage increases current within first clock buffer 150, and the higher current sink tends to reduce the common-mode voltage of the outputs of first clock buffer 150. Thus the higher common-mode voltage is reduced in first clock buffer 150.

The higher VCM1 also causes second equalizer 162 to have a lower voltage on its + than its – input, causing equalizer 162 to decrease its output, second control voltage VCTL2. The lower VCTL2 is applied to second clock buffer 152. The control voltage may be applied as a bias voltage to an n-channel transistor current sink inside clock buffer 152. As VCTL2 falls, the lower bias voltage decreases current within second clock buffer 152, and the lower amount of current through the current sinks tend to raise the common-mode voltage of the outputs of second clock buffer 152, since the current sources or pull-ups are not changed by the bias voltage VCTL2. Thus the lower common-mode voltage is increased in second clock buffer 152.

The push-pull effect of equalizers 160, 162 tends to rapidly equalize the common mode voltages of both differential clocks, since both clock buffers 150, 152 are simultaneously adjusted.

Figure 4:
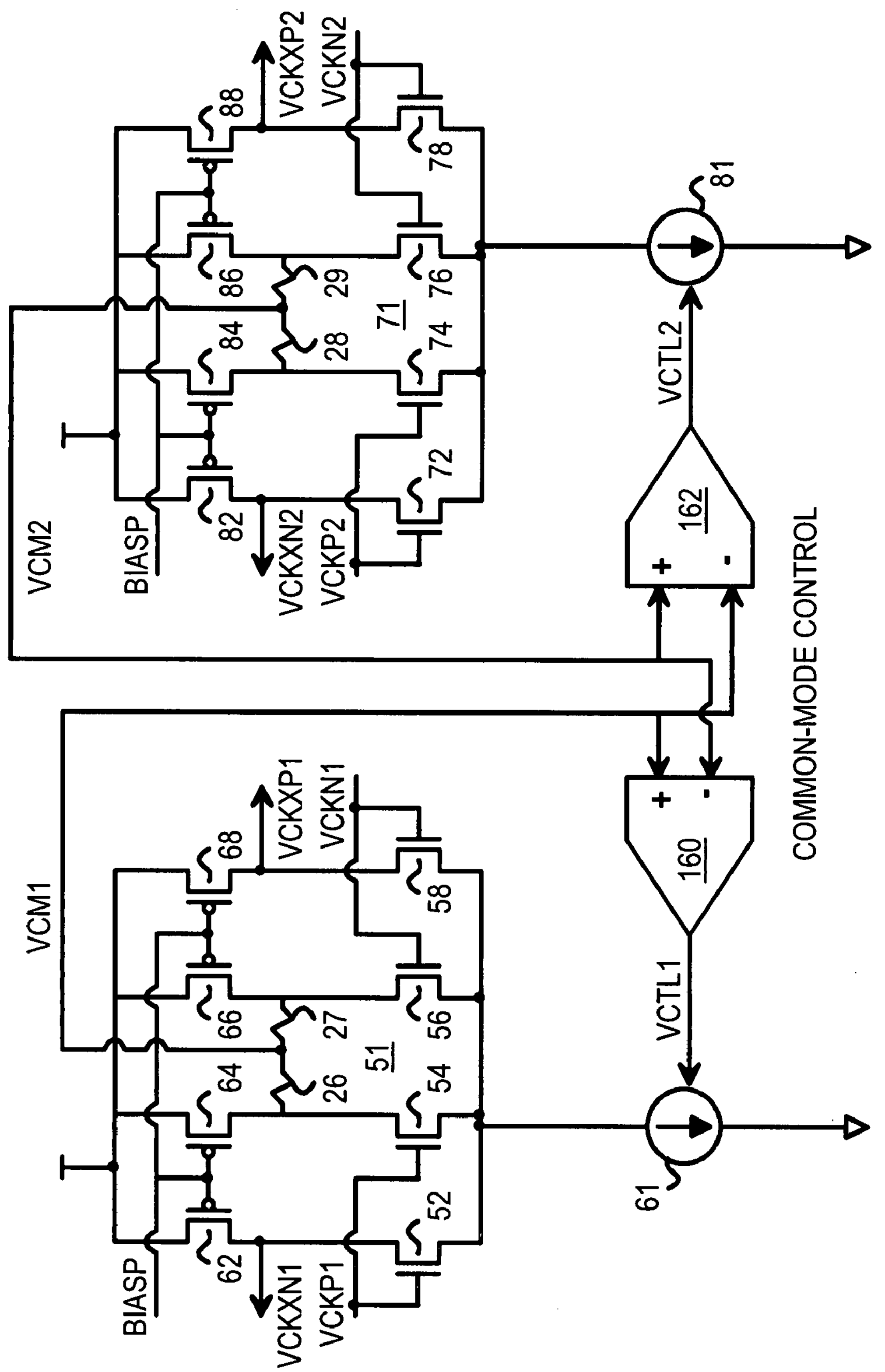
FIG. 4 is a circuit schematic of differential input buffers with an integrated common-mode sense and equalizer.

FIG. 4 is a circuit schematic of differential input buffers with an integrated common-mode sense and equalizer. Clock buffers 51, 71 are differential buffers such as clock buffers 150, 152 of FIG. 3, but also include integrated common-mode sensors.

The reference clock REFCK is applied as differential inputs VCKP1, VCKN1 to clock buffer 51, which generates outputs VCKXP1, VCKXN1. The feedback clock FBCK is applied as differential inputs VCKP2, VCKN2 to clock buffer 71, which outputs second differential clock VCKXP2, VCKXN2.

In clock buffer 51, positive clock input VCKP1 is applied to the gates of n-channel transistors 52, 54, while negative clock input VCKN1 is applied to the gates of n-channel transistors 56, 58. Transistors 52, 54, 56, 58 have their sources connected together and to current sink 61, which is controlled by VCTL1.

Bias voltage BIASP is applied to the gates of p-channel current mirror transistors 62, 64, 66, 68, which have drains connected to the drains of n-channel transistors 52, 54, 56, 58, respectively. The drains of transistors 52, 62 are the output node for VCKXN1, while the drains of transistors 58, 68 are the output node for VCKXP1.

The drains of transistors 54, 64 are connected to resistor 26, while the drains of transistors 56, 66 are connected to resistor 27. The other terminals of resistors 26, 27 are connected together as sensed common-mode voltage VCM1. When resistors 26, 27 have the same resistance value, the node between them is the average of the two drain voltages, which is also the common-mode voltage.

When differential input VCKP1 rises and VCKN1 falls, n-channel transistors 52, 54 draw more current and n-channel transistors 56, 58 draw less current. The drains of transistors 52, 54 fall in voltage while the drains of transistors 56, 58 rise in voltage differential output VCKXN1 falls and VCKXP1 rises.

In clock buffer 71, positive clock input VCKP2 is applied to the gates of n-channel transistors 72, 74, while negative clock input VCKN2 is applied to the gates of n-channel transistors 76, 78. Transistors 72, 74, 76, 78 have their sources connected together and to current sink 81, which is controlled by VCTL2.

Bias voltage BIASP is applied to the gates of p-channel current mirror transistors 82, 84, 86, 88, which have drains connected to the drains of n-channel transistors 72, 74, 76, 78, respectively. The drains of transistors 72, 82 are the output node for VCKXN2, while the drains of transistors 78, 88 are the output node for VCKXP2.

The drains of transistors 74, 84 are connected to resistor 28, while the drains of transistors 76, 86 are connected to resistor 29. The other terminals of resistors 28, 29 are connected together as sensed common-mode voltage VCM2. When resistors 28, 29 have the same resistance value, the node between them is the average of the two drain voltages, which is also the common-mode voltage.

When differential input VCKP2 rises and VCKN2 falls, n-channel transistors 72, 74 draw more current and n-channel transistors 76, 78 draw less current. The drains of transistors 72, 74 fall in voltage while the drains of transistors 76, 78 rise in voltage differential output VCKXN2 falls and VCKXP2 rises.

Equalizer 160 receives VCM1 on its non-inverting (+) input, and VCM2 on its inverting (−) input, and generates first control voltage VCTL1 as the difference of VCM1, VCM2. Equalizer 162 receives VCM2 on its non-inverting (+) input, and VCM1 on its inverting (−) input, and generates second control voltage VCTL2 as the difference VCM2-VCM1.

The first control voltage VCTL1 is applied to first current sink 61, while the second control voltage VCTL2 is applied to second current sink 81. The control voltages control the delay and common-mode voltage of clock buffers 51, 71. When VCTL1 increases, first current sink 61 increases the amount of current sunk, which lowers the drain voltages of transistors 52, 54, 56, 58, and thus lowers the common-mode voltage of outputs VCKXP1, VCKXN1.

When VCTL1 decreases, first current sink 61 decreases the amount of current sunk, which raises the drain voltages of transistors 52, 54, 56, 58, and thus raises the common-mode voltage of outputs VCKXP1, VCKXN1. VCTL2 similarly controls second current sink 81 to adjust common-mode voltage of outputs VCKXP2, VCKXN2.

Figure 5:
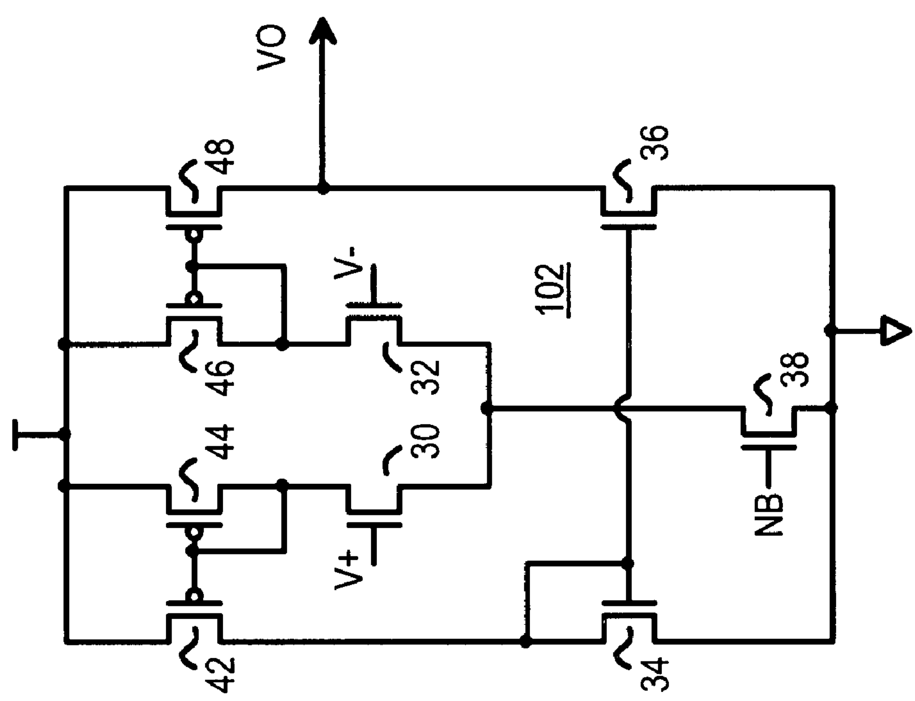
FIG. 5 is a schematic of a differential-to-single-ended (DTS) amplifier.

FIG. 5 is a schematic of a differential-to-single-ended (DTS) amplifier. A differential input V+, V− is applied to the gates of n-channel transistors 30, 32, respectively, that have their sources connected together and to n-channel current sink transistor 38, which has a bias voltage NB applied to its gate.

The drains of n-channel transistor 30 and p-channel transistor 44 are connected together and to the gates of p-channel transistors 42, 44. Thus the current through p-channel transistor 44 is mirrored to p-channel transistor 42. The current mirrored to p-channel transistor 42 also flows through n-channel transistor 34. Since the gate and drain of n-channel transistor 34 are connected together and to the gate of n-channel transistor 36, the current through n-channel transistor 34 is mirrored over to n-channel transistor 36, which has its drain connected to the single-ended output VO.

The drains of n-channel transistor 32 and p-channel transistor 46 are connected together and to the gates of p-channel transistors 46, 48. Thus the current through p-channel transistor 46 is mirrored to p-channel transistor 48.

The current mirrored to p-channel transistor 48 drives the output VO, which is the drain of p-channel transistor 48 and of n-channel transistor 36. The output VO is both pulled up by p-channel transistor 48 and pulled down by n-channel transistor 36.

When V+rises above V−, n-channel transistor 30 draws more current than n-channel transistor 32, causing the drain of n-channel transistor 30 to fall relative to the drain of n-channel transistor 32. More current flows through p-channel transistors 42, 44 than through p-channel transistors 46, 48, causing less pull-up current to output VO from p-channel transistor 48, lowering VO. Also, the higher current through p-channel transistor 42 also flows through n-channel transistor 34, which is mirrored to n-channel transistor 36. The higher pull-down current through n-channel transistor 36 drives VO lower. Thus a differential signal V+, V− is converted to a single-ended signal VO.

DTS amplifier 102 can be used as DTS converter 14, 18 in FIG. 2, or as common-mode equalizers 160, 162 of FIGS. 3, 4, 7-9. As shown in FIG. 5, DTS amplifier 102 is inverting, but can be made non-inverting for use in FIGS. 3, 4, 7-9 by swapping V+, V−.

Figure 6:
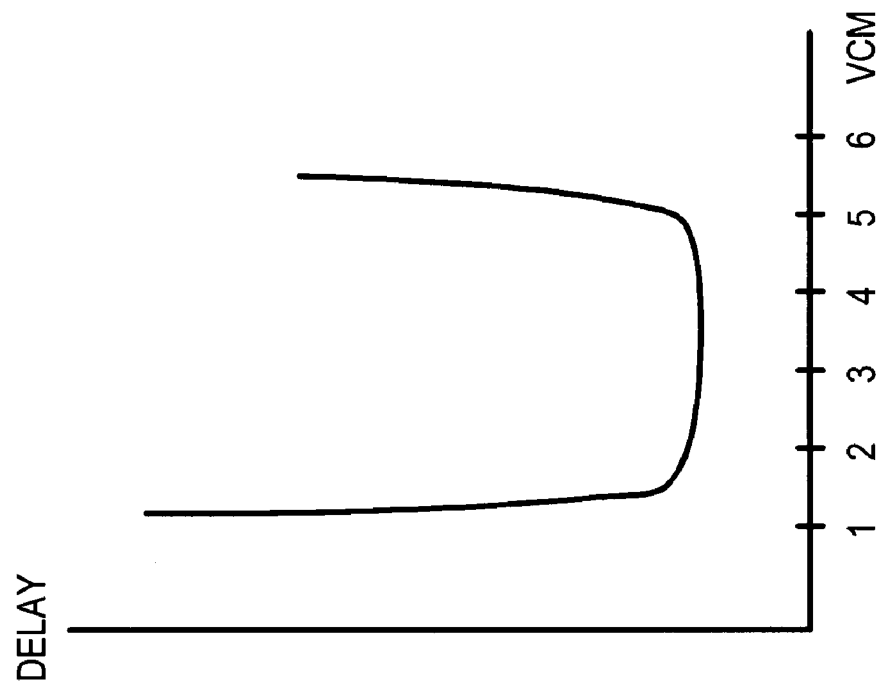
FIG. 6 is a graph of delay in a DTS amplifier as a function of common-mode voltage.

FIG. 6 is a graph of delay in a DTS amplifier as a function of common-mode voltage. DTS amplifier 102 of FIG. 5 has the delay curve shown in FIG. 6. When the common-mode voltage (V+−V−) is between 2 and 5 volts, the delay through DTS amplifier 102 is near the minimum. However, when the common-mode voltage rises above 5 volts, the delay increases sharply. Also, when the common-mode voltage is below 2 volts, delay increases significantly. Thus common-mode voltage can significantly affect delay. Common-mode sense and equalizer 110 of FIG. 2, as shown in FIGS. 3, 4, can reduce delay variations due to differences in common-mode voltages of the reference and feedback clocks by targeting a common-mode voltage between 2 and 5 volts, such as 3.0 volts for a 5-colt power supply.

Figure 7:
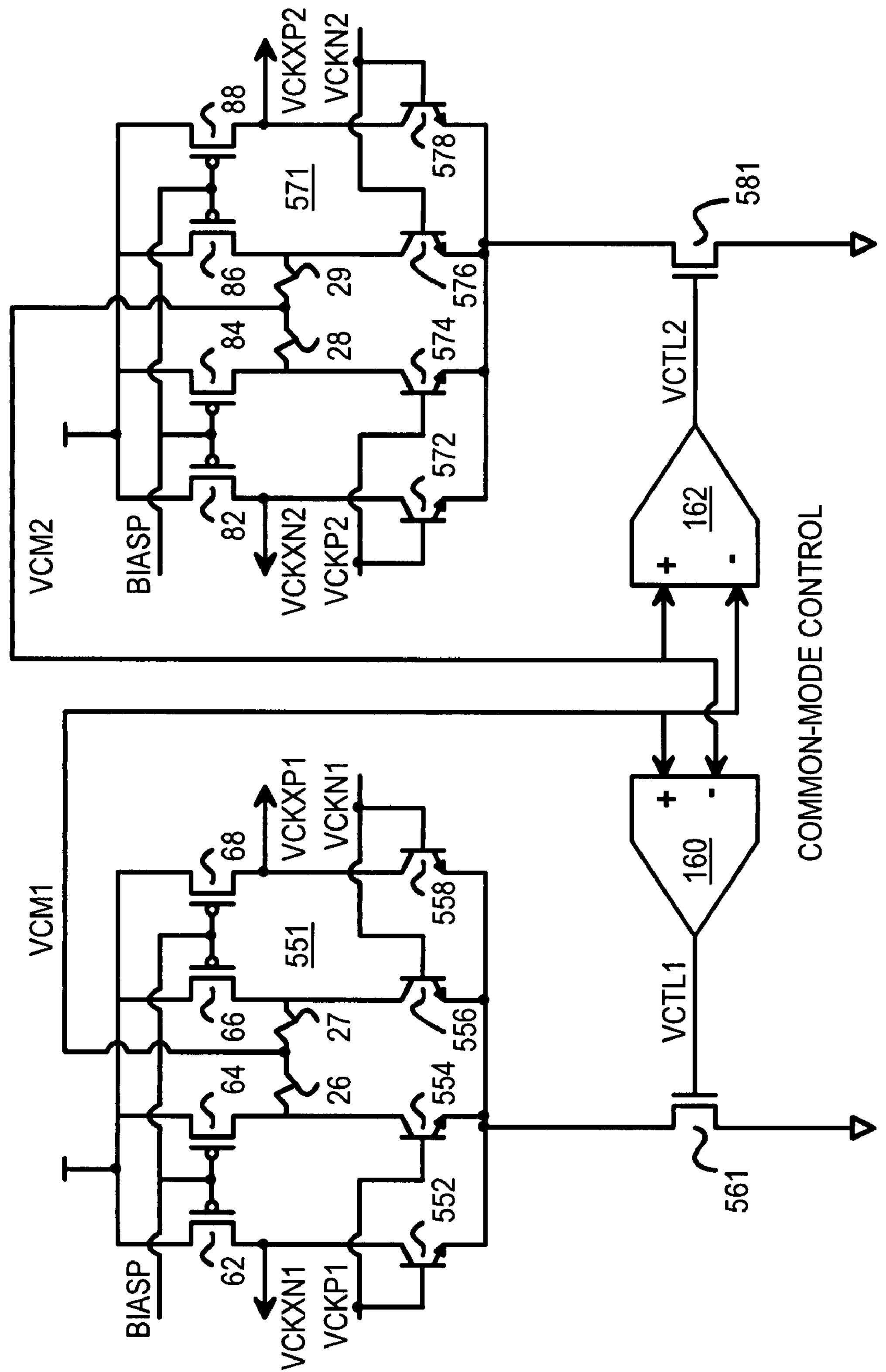
FIG. 7 is a BiCMOS embodiment of the differential input buffers with integrated common-mode sense and equalizer.

FIG. 7 is a BiCMOS embodiment of the differential input buffers with integrated common-mode sense and equalizer. In clock buffer 551, NPN transistors 552, 554, 556, 558 replace n-channel transistors 52, 54, 56, 58 of FIG. 4. Likewise, in clock buffer 571, NPN transistors 572, 574, 576, 578 replace n-channel transistors 72, 74, 76, 78 of FIG. 4.

Also, current sink 61 is implemented as n-channel transistor 561, and current sink 81 is implemented as n-channel transistor 581. Control voltage VCTL1 drives the gate of n-channel transistor 561, while control voltage VCTL2 drives the gate of n-channel transistor 581.

The NPN transistors each have a base that draws some current from the clock inputs, rather than a gate that does not draw current. However, the current drive can be higher with NPN transistors. Otherwise, circuit operation is similar to that described for FIG. 4.

Figure 8:
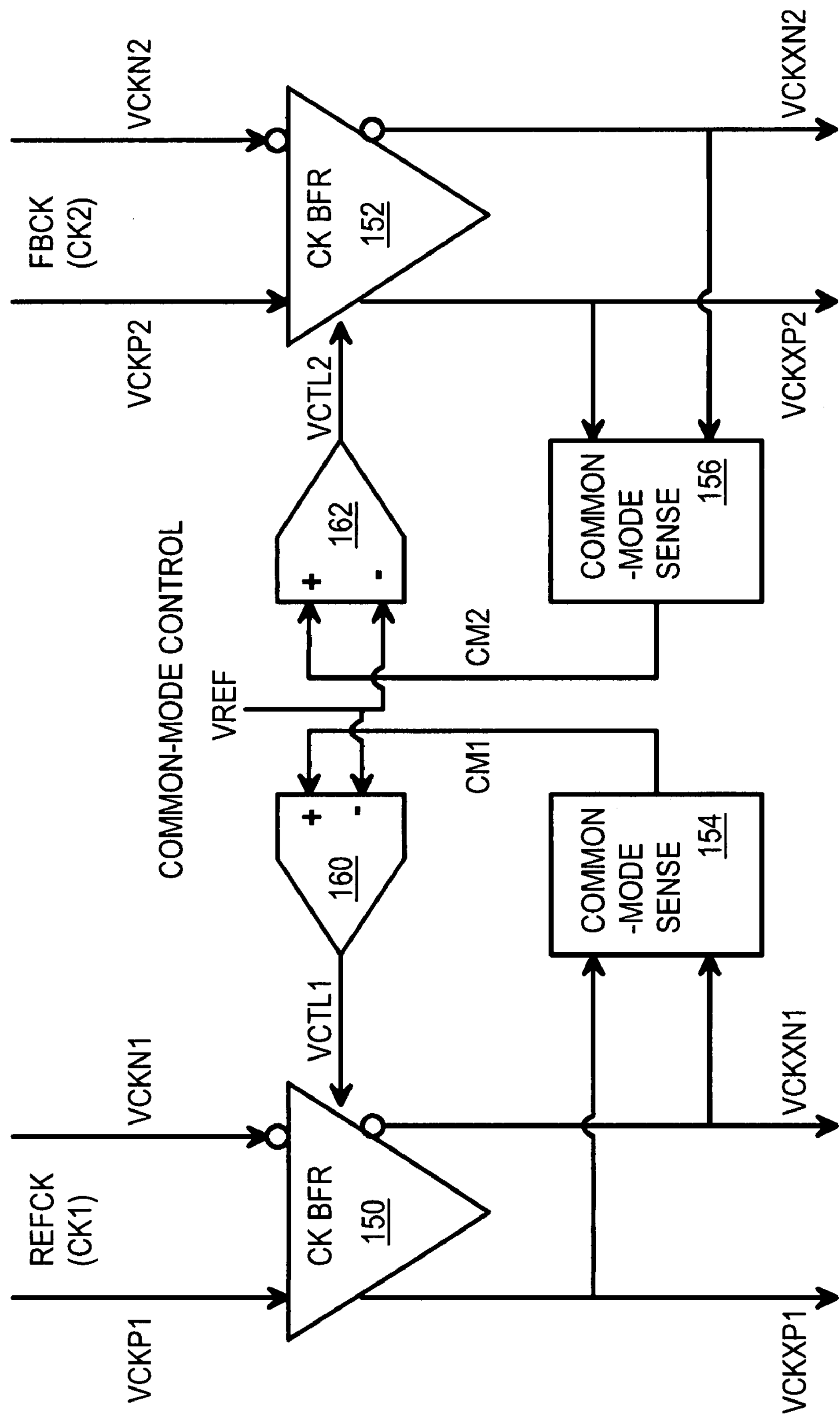
FIG. 8 is an alternative common-mode sense and equalizer using a reference voltage in the equalizer.

FIG. 8 is an alternative common-mode sense and equalizer using a reference voltage in the equalizer. Clock buffers 150, 152 are differential buffers such as differential buffers 12, 16 in FIG. 2, while common-mode sensors 154, 156 and common-mode equalizers 160, 162 are an implementation of common-mode sense and equalizer 110 of FIG. 2. The circuit operates as described for FIG. 3, except that the non-inverting (−) inputs to equalizers 160, 162 are driven by a reference voltage VREF rather than by the other one of common-mode sensors 154, 156. VREF is an internal reference voltage that is the target for the common mode voltage.

Common-mode sensor 154 still generates first common-mode voltage CM1. Common-mode sensor 156 still generates second common-mode voltage CM2.

Equalizer 160 receives CM1 on its non-inverting (+) input, and reference voltage VREF on its inverting (−) input, and generates first control voltage VCTL1 as the difference CM1-VREF. Equalizer 162 receives CM2 on its non-inverting (+) input, and VREF on its inverting (−) input, and generates second control voltage VCTL2 as the difference CM2-VREF.

When the common mode voltage of the buffered reference clock is higher than the target common mode voltage VREF, the higher VCM1 causes first equalizer 160 to have a higher voltage on its + than its − input. This positive voltage difference causes equalizer 160 to increase its output, first control voltage VCTL1. The higher VCTL1 is applied to first clock buffer 150. The control voltage may be applied as a bias voltage to an n-channel transistor current sink inside clock buffer 150. As VCTL1 rises, the higher bias voltage increases current within first clock buffer 150, and the higher current sink tends to reduce the common-mode voltage of the outputs of first clock buffer 150. Thus the higher common-mode voltage is reduced in first clock buffer 150.

When the common mode voltage of the buffered reference clock is lower than the target common mode voltage VREF, the lower VCM1 causes first equalizer 160 to have a lower voltage on its + than its − input. This negative voltage difference causes equalizer 160 to decrease its output, first control voltage VCTL1. The lower VCTL1 is applied to first clock buffer 150. The control voltage may be applied as a bias voltage to an n-channel transistor current sink inside clock buffer 150. As VCTL1 falls, the lower bias voltage decreases current within first clock buffer 150, and the lower current sink tends to increase the common-mode voltage of the outputs of first clock buffer 150. Thus the lower common-mode voltage is reduced in first clock buffer 150 until it reached the target, VREF.

Adjustment of the second differential clock is similar. When the common mode voltage of the buffered feedback clock is higher than the target common mode voltage VREF, the higher VCM2 causes second equalizer 162 to have a higher voltage on its + than its − input. This positive voltage difference causes equalizer 162 to increase its output, second control voltage VCTL2. The higher VCTL2 is applied to second clock buffer 152. The control voltage may be applied as a bias voltage to an n-channel transistor current sink inside clock buffer 152. As VCTL2 rises, the higher bias voltage increases current within second clock buffer 152, and the higher current sink tends to reduce the common-mode voltage of the outputs of second clock buffer 152. Thus the higher common-mode voltage is reduced in second clock buffer 152.

When the common mode voltage of the buffered reference clock is lower than the target common mode voltage VREF, the lower VCM2 causes second equalizer 162 to have a lower voltage on its + than its − input. This negative voltage difference causes equalizer 162 to decrease its output, second control voltage VCTL2. The lower VCTL2 is applied to second clock buffer 152. The control voltage may be applied as a bias voltage to an n-channel transistor current sink inside clock buffer 152. As VCTL2 falls, the lower bias voltage decreases current within second clock buffer 152, and the lower current sink tends to increase the common-mode voltage of the outputs of second clock buffer 152. Thus the lower common-mode voltage is reduced in second clock buffer 152 until it reached the target, VREF.

Equalization of the reference and feedback clocks is independent of each other in this embodiment. The common-mode voltage of the reference clock does not adjust the clock buffer of the feedback clock, nor does the common-mode voltage of the feedback clock adjust the clock buffer of the reference clock. Two separate control loops are used, one for each clock.

The common mode voltage CM1 of the buffered reference clock is only compared to the target common-mode voltage, VREF, by equalizer 160, without regard to the common-mode voltage of the feedback clock. Equalizer 160 adjusts the common mode voltage of first clock buffer 150 until the common-mode voltage matches the target.

Likewise, the common mode voltage CM2 of the buffered feedback clock is only compared to the target common-mode voltage, VREF, by equalizer 162, without regard to the common-mode voltage of the reference clock. Equalizer 162 adjusts the common mode voltage of second clock buffer 152 until the common-mode voltage matches the target.

Figure 9:
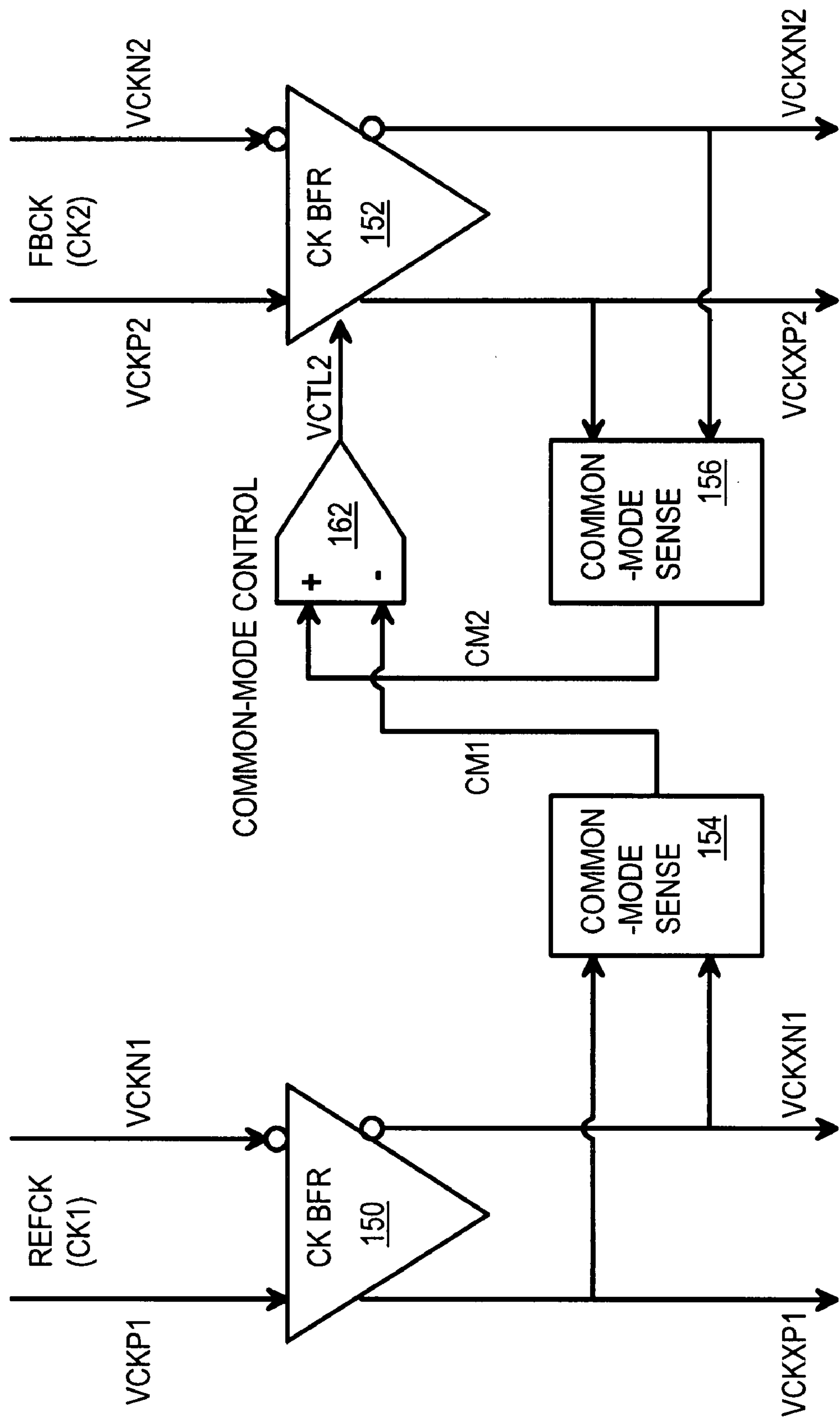
FIG. 9 is an alternative common-mode sense and equalizer that adjusts only one clock.

FIG. 9 is an alternative common-mode sense and equalizer that adjusts only one clock. Clock buffers 150, 152 are differential buffers such as differential buffers 12, 16 in FIG. 2, while common-mode sensors 154, 156 and common-mode equalizer 162 are an implementation of common-mode sense and equalizer 110 of FIG. 2.

This circuit operates as described for FIG. 3, except that only one equalizer is used. First equalizer 160 is deleted, and the common-mode voltage of first clock buffer 150 is not adjusted, but allowed to shift freely.

Instead, second equalizer 162 is used to adjust the common-mode voltage of the buffered feedback clock to match the common-mode voltage of the reference clock.

When the common mode voltage of the reference clock is higher than the common mode voltage of the feedback clock, VCM1 is greater than VCM2. The higher VCM1 causes second equalizer 162 to have a lower voltage on its + than its − input, causing equalizer 162 to decrease its output, second control voltage VCTL2. The lower VCTL2 is applied to second clock buffer 152. The control voltage may be applied as a bias voltage to an n-channel transistor current sink inside clock buffer 152. As VCTL2 falls, the lower bias voltage decreases current within second clock buffer 152, and the lower amount of current through the current sinks tend to raise the common-mode voltage of the outputs of second clock buffer 152, since the current sources or pull-ups are not changed by the bias voltage VCTL2. Thus the lower common-mode voltage is increased in second clock buffer 152 until CM2 matches CM1.

When the common mode voltage of the reference clock is lower than the common mode voltage of the feedback clock, VCM1 is less than VCM2. The lower VCM1 causes second equalizer 162 to have a higher voltage on its + than its − input, causing equalizer 162 to increase its output, second control voltage VCTL2. The higher VCTL2 is applied to second clock buffer 152.

As VCTL2 rises, the higher bias voltage increases current within second clock buffer 152, and the higher current sink tends to lower the common-mode voltage of the outputs of second clock buffer 152. Thus the higher common-mode voltage sensed is decreased in second clock buffer 152 until CM2 matches CM1.

Since only one clock buffer is adjusted in this embodiment, equalization may require more time. However, the circuit is simplified. Rather than use only second equalizer 162, only first equalizer 160 could be used, and the buffered reference clock from first clock buffer 150 is adjusted instead of the buffered feedback clock.

ALTERNATE EMBODIMENTS

Several other embodiments are contemplated by the inventors. For example p-channel and n-channel transistors could be swapped in the circuit. Additional components may be added at various nodes, such as resistors, capacitors, inductors, transistors, etc., and parasitic components may also be present. Enabling and disabling the circuit could be accomplished with transistors in various locations in the circuit. Pass-gate transistors or transmission gates could be added for isolation.

Equalizers 160, 162 may be differential-to-single-ended (DTS) converters, differential amplifiers, op amps, or other detector circuits. A simple capacitor may be used as the filter on the VCO input, or a more complex R-C network be used. Bias voltages may be externally generated and input to the chip, or may be generated from a voltage divider, a band-gap reference, or another bias-voltage generator circuit. Clock buffers, differential amplifiers and buffer and other circuits may be implemented in a variety of ways.

Inversions may be added, or extra buffering. The final sizes of transistors and capacitors may be selected after circuit simulation or field testing. Metal-mask options or other programmable components may be used to select the final capacitor size or final transistor sizes. Various components may be integrated or split. For example, a single-ended VCO may be used that drives a buffer that outputs a true and a complement signals of a differential clock.

While Complementary-Metal-Oxide-Semiconductor (CMOS) transistors have been described, other transistor technologies and variations may be substituted, and materials other than silicon may be used, such as Galium-Arsinide (GaAs) and other variations.

While positive currents have been described, currents may be negative or positive, as electrons or holes may be considered the carrier in some cases. Charging and discharging may be interchangeable terms when referring to carriers of opposite polarity. Currents may flow in the reverse direction.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another a tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A differential clock generator comprising:

a reference clock input for receiving a reference clock, wherein the reference clock is a differential clock represented by a difference of signals carried by a true signal line and by a complement signal line;

a first differential clock buffer, receiving the reference clock on a true input and on a complement input, the first differential clock buffer sensing a voltage difference between the true input and the complement input and driving a true output and a complement output with a buffered reference clock;

a first differential-to-single-ended (DTS) converter, receiving the buffered reference clock on a true input and on a complement input, the first DTS converter generating a combined reference clock signal as a difference of the true input and the complement input;

a second differential clock buffer, receiving a feedback clock on a true input and on a complement input, the second differential clock buffer sensing a voltage difference between the true input and the complement input and driving a true output and a complement output with a buffered feedback clock;

a second DTS converter, receiving the buffered feedback clock on a true input and on a complement input, the second DTS converter generating a combined feedback clock signal as a difference of the true input and the complement input;

a phase detector having a first input that receives the combined reference clock signal from the first DTS converter and having a second input that receives the combined feedback clock signal from the second DTS converter, the phase detector detecting a phase difference between the combined reference clock signal and the combined feedback clock signal and generating an up signal and a down signal in response to the phase difference detected;

a sensing capacitor for storing charge to generate a sensing voltage;

a first charge pump, activated by the up signal from the phase detector, for charging the sensing capacitor;

a second charge pump, activated by the down signal from the phase detector, for discharging the sensing capacitor;

a voltage-controlled oscillator (VCO) that receives the sensing voltage from the sensing capacitor, the VCO generating the feedback clock with a frequency that is dependent on the sensing voltage, wherein the VCO outputs a true signal and a complement signal for the feedback clock;

an output differential clock buffer, receiving the feedback clock on a true input and on a complement input, the output differential clock buffer sensing a voltage difference between the true input and the complement input and driving a true output and a complement output with a buffered output clock;

a first common-mode sensor, coupled to the first differential clock buffer to sense a first common-mode voltage of the true output and the complement output from the first differential clock buffer;

a second common-mode sensor, coupled to the second differential clock buffer to sense a second common-mode voltage of the true output and the complement output from the second differential clock buffer; and a first equalizer, receiving the first common-mode voltage from the first common-mode sensor, and receiving the second common-mode voltage from the second common-mode sensor, for generating a second control voltage;

wherein the second control voltage is applied to the second differential clock buffer, the second control voltage adjusting the second common-mode voltage of the true output and the complement output from the second differential clock buffer, whereby the second common-mode voltage is adjusted by the second equalizer and the second common-mode sensor.

2. The differential clock generator of claim 1 further comprising:

a first equalizer, receiving the first common-mode voltage from the first common-mode sensor, and receiving the second common-mode voltage from the second common-mode sensor, for generating a first control voltage;

wherein the first control voltage is applied to the first differential clock buffer, the first control voltage adjusting the first common-mode voltage of the true output and the complement output from the first differential clock buffer.

3. The differential clock generator of claim 2 wherein the second equalizer is a differential-to-single-ended (DTS) converter.

4. The differential clock generator of claim 2 further comprising:

a first current sink in the first differential clock buffer, the first current sink being controlled by the first control voltage to adjust sink current in the first differential clock buffer to adjust the first common-mode voltage; and a second current sink in the second differential clock buffer, the second current sink being controlled by the second control voltage to adjust sink current in the second differential clock buffer to adjust the second common-mode voltage.

5. The differential clock generator of claim 4 wherein the first differential clock buffer comprises:

a first sense differential transistor having a gate controlled by the true input, and a source coupled to the first current sink, and a drain connected to a first sense node;

a first output differential transistor having a gate controlled by the true input, and a source coupled to the first current sink, and a drain connected to a first output node;

a first current mirror for mirroring current through the first sense differential transistor to the first output differential transistor;

a second sense differential transistor having a gate controlled by the true input, and a source coupled to the second current sink, and a drain connected to a second sense node;

a second output differential transistor having a gate controlled by the true input, and a source coupled to the second current sink, and a drain connected to a second output node; and a second current mirror for mirroring current through the second sense differential transistor to the second output differential transistor.

6. The differential clock generator of claim 5 wherein the first current mirror comprises:

a first sense mirror transistor coupled to the drain of the first sense differential transistor; and a first output mirror transistor coupled to the drain of the first output differential transistor;

wherein the second current mirror comprises a second sense mirror transistor coupled to the drain of the second sense differential transistor, and a second output mirror transistor coupled to the drain of the second output differential transistor.

7. The differential clock generator of claim 6 wherein gates of the first sense mirror transistor, the first output mirror transistor, the second sense mirror transistor, and the second output mirror transistor are coupled together and to a mirror bias voltage.

8. The differential clock generator of claim 7 wherein the first sense mirror transistor, the first output mirror transistor, the second sense mirror transistor, and the second output mirror transistor comprise p-channel transistors.

9. The differential clock generator of claim 8 wherein the first sense differential transistor, the first output differential transistor, the second sense differential transistor, and the second output differential transistor comprise n-channel transistors.

10. The differential clock generator of claim 8 wherein the first sense differential transistor, the first output differential transistor, the second sense differential transistor, and the second output differential transistor comprise NPN bipolar transistors.

11. The differential clock generator of claim 5 wherein the first common-mode sensor comprises:

a first sense resistor coupled between the first sense node and a first common-mode node; and a second sense resistor coupled between the second sense node and the first common-mode node;

wherein the first common-mode node carries the first common-mode voltage.

12. The differential clock generator of claim 1 further comprising:

a plurality of output differential clock buffers, each receiving the feedback clock on a true input and on a complement input, each output differential clock buffer sensing a voltage difference between the true input and the complement input and driving a true output and a complement output with a buffered output clock, whereby a plurality of differential buffered output clocks are generated.

13. The differential clock generator of claim 12 wherein the buffered reference clock is output as a first output clock;

wherein static phase offset between the first output clock and the plurality of differential buffered output clocks is reduced by adjusting the second common-mode voltage using the second equalizer and the second common-mode sensor.

14. A differential phase-locked loop (PLL) comprising:

a differential reference clock characterized by a first input common-mode voltage of a first pair of differential signals carrying the differential reference clock;

a differential feedback clock characterized by a second input common-mode voltage of a second pair of differential signals carrying the differential feedback clock;

wherein the first input common-mode voltage and the second input common-mode voltage are different voltages;

a first differential buffer receiving the first pair carrying the differential reference clock, and generating a first buffered pair carrying a differential buffered reference clock;

a first differential-to-single-ended converter, receiving the first buffered pair, and generating a first single-ended clock;

a second differential buffer receiving the second pair carrying the differential feedback clock, and generating a second buffered pair carrying a differential buffered feedback clock;

a second differential-to-single-ended converter, receiving the second buffered pair, and generating a second single-ended clock;

a first common-mode sensor, coupled to the first differential buffer, for generating a first sensed common-mode voltage;

a second common-mode sensor, coupled to the second differential buffer, for generating a second sensed common-mode voltage;

a first equalizer, receiving the first sensed common-mode voltage, for adjusting a common-mode voltage of the first buffered pair carrying the differential buffered reference clock in response to the first sensed common-mode voltage;

a phase comparator, receiving the first single-ended clock from the first differential-to-single-ended converter, and receiving the second single-ended clock from the second differential-to-single-ended converter, for generating a charge signal and a discharge signal in response to a phase difference between the first single-ended clock and the second single-ended clock;

a filter capacitor generating a sense voltage;

a charger for charging the filter capacitor in response to the charge signal from the phase comparator;

a discharger for discharging the filter capacitor in response to the discharge signal from the phase comparator; and a voltage-controlled oscillator that generates the differential feedback clock having a frequency controlled by the sense voltage of the filter capacitor, whereby static phase offset between the differential reference clock and the differential feedback clock caused by a difference in the first input common-mode voltage and the second input common-mode voltage is compensated for by the first equalizer.

15. The differential phase-locked loop of claim 14 further comprising:

a second equalizer, receiving the second sensed common-mode voltage, for adjusting a common-mode voltage of the second buffered pair carrying the differential buffered feedback clock in response to the second sensed common-mode voltage.

16. The differential phase-locked loop of claim 15 further comprising:

a target voltage, applied to the first equalizer and applied to the second equalizer, the first equalizer comparing the first sensed common-mode voltage to the target voltage to generate a first control voltage applied to the first differential buffer to adjust the common-mode voltage of the first buffered pair carrying the differential buffered reference clock;

wherein the target voltage is also applied to the second equalizer and applied to the second equalizer, the second equalizer comparing the second sensed common-mode voltage to the target voltage to generate a second control voltage applied to the second differential buffer to adjust the common-mode voltage of the second buffered pair carrying the differential buffered feedback clock, whereby sensed common-mode voltages are compared to the target voltage to generate control voltages to differential buffers.

17. The differential phase-locked loop of claim 15 wherein the first equalizer also receives the second sensed common-mode voltage, the first equalizer comparing the first sensed common-mode voltage to the second sensed common-mode voltage to generate a first control voltage applied to the first differential buffer to adjust the common-mode voltage of the first buffered pair carrying the differential buffered reference clock;

wherein the second equalizer also receives the first sensed common-mode voltage, the second equalizer comparing the second sensed common-mode voltage to the first sensed common-mode voltage to generate a second control voltage applied to the second differential buffer to adjust the common-mode voltage of the second buffered pair carrying the differential buffered feedback clock.

18. A zero-delay buffer comprising:

a differential reference clock carried over a first pair of differential lines, the differential reference clock having a first input common-mode voltage;

a differential feedback clock carried over a second pair of differential lines, the differential feedback clock having a second input common-mode voltage wherein the first input common-mode voltage and the second input common-mode voltage are different voltages that can cause static phase offset;

first differential buffer means, receiving the first pair carrying the differential reference clock, for generating a first buffered pair carrying a differential buffered reference clock;

first differential-to-single-ended converter means, receiving the first buffered pair, for generating a first single-ended clock;

second differential buffer means, receiving the second pair carrying the differential feedback clock, for generating a second buffered pair carrying a differential buffered feedback clock;

second differential-to-single-ended converter means, receiving the second buffered pair, for generating a second single-ended clock;

first common-mode sensor means, coupled to the first differential buffer means, for generating a first sensed common-mode voltage;

second common-mode sensor means, coupled to the second differential buffer means, for generating a second sensed common-mode voltage;

first equalizer means, receiving the first sensed common-mode voltage, for adjusting a common-mode voltage of the first buffered pair carrying the differential buffered reference clock in response to the first sensed common-mode voltage;

phase compare means, receiving the first single-ended clock from the first differential-to-single-ended converter means, and receiving the second single-ended clock from the second differential-to-single-ended converter means, for generating a charge signal and a discharge signal in response to a phase difference between the first single-ended clock and the second single-ended clock;

filter capacitor means for generating a sense voltage;

charge means for charging the filter capacitor means in response to the charge signal from the phase compare means;

discharge means for discharging the filter capacitor means in response to the discharge signal from the phase compare means;

voltage-controlled oscillator means for generating the differential feedback clock having a frequency controlled by the sense voltage of the filter capacitor means; and first output differential clock buffer means, receiving the differential feedback clock, for driving a first differential buffered output clock, whereby static phase offset between the differential reference clock and the first differential buffered output clock caused by a difference in the first input common-mode voltage and the second input common-mode voltage is compensated for by the first equalizer means.

19. The zero-delay buffer of claim 18 further comprising:

second equalizer means, receiving the second sensed common-mode voltage, for adjusting a common-mode voltage of the second buffered pair carrying the differential buffered feedback clock in response to the second sensed common-mode voltage.

20. The zero-delay buffer of claim 18 further comprising:

second output differential clock buffer means, receiving the differential feedback clock, for driving a second differential buffered output clock;

third output differential clock buffer means, receiving the differential feedback clock, for driving a third differential buffered output clock;

wherein the differential buffered reference clock generated by the first differential buffer means is output as a fourth differential buffered output clock;

whereby static phase offset between the first, second, third, and fourth differential buffered output clock is reduced by the first equalizer means compensating for differences in common-mode voltages.

* * * * *